United States Patent
Sun

(10) Patent No.: US 8,963,515 B2
(45) Date of Patent: Feb. 24, 2015

(54) CURRENT SENSING CIRCUIT AND CONTROL CIRCUIT THEREOF AND POWER CONVERTER CIRCUIT

(75) Inventor: Jianning Sun, Guangdong (CN)

(73) Assignee: Sunsun Lighting China Co. Ltd (CN)

(*) Notice: Subject to any disclaimer, the term of this patent is extended or adjusted under 35 U.S.C. 154(b) by 0 days.

(21) Appl. No.: 13/641,863

(22) PCT Filed: Mar. 15, 2011

(86) PCT No.: PCT/CN2011/071802
§ 371 (c)(1),
(2), (4) Date: Sep. 18, 2013

(87) PCT Pub. No.: WO2012/122701
PCT Pub. Date: Sep. 20, 2012

(65) Prior Publication Data
US 2014/0016384 A1    Jan. 16, 2014

(51) Int. Cl.
*H02M 3/158* (2006.01)
*H02M 7/217* (2006.01)

(52) U.S. Cl.
USPC ........................................ 323/225; 323/271

(58) Field of Classification Search
USPC ................. 363/81, 82; 323/222, 225, 271, 323/282–290, 351
See application file for complete search history.

(56) References Cited

U.S. PATENT DOCUMENTS

| | | | | |
|---|---|---|---|---|
| 5,523,676 A | 6/1996 | Bach et al. | | 324/103 |
| 7,449,869 B2* | 11/2008 | Markowski | | 323/283 |
| 7,486,063 B1* | 2/2009 | Gu et al. | | 323/288 |
| 7,663,352 B2 | 2/2010 | Yang et al. | | 323/271 |
| 2006/0043943 A1* | 3/2006 | Huang et al. | | 323/222 |
| 2008/0284411 A1 | 11/2008 | Kunc et al. | | 324/123 |
| 2009/0058389 A1 | 3/2009 | Yang et al. | | 323/301 |
| 2011/0260703 A1* | 10/2011 | Laur et al. | | 323/271 |

FOREIGN PATENT DOCUMENTS

| | | | |
|---|---|---|---|
| CN | 101202510 A | 6/2008 | ............ H02M 3/335 |
| JP | 2009-254047 | 10/2009 | ............ H02M 3/155 |

OTHER PUBLICATIONS

International Search Report (with English translation) issued Dec. 29, 2011 in PCTCN2011/071802, 6 pgs.

* cited by examiner

*Primary Examiner* — Jessica Han
(74) *Attorney, Agent, or Firm* — Hayes Soloway P.C.

(57) ABSTRACT

A current sensing circuit and the control circuit thereof and a power converter circuit. The current sensing circuit includes a sample and hold circuit (1), a rising edge detecting circuit (2), a falling edge detecting circuit (3), a timing control circuit (4), a synchronous detecting circuit (5) and a low pass filter (6). The power converter circuit uses the current sensing circuit to sense and process the current flowing through a main switch (S1).

16 Claims, 5 Drawing Sheets

CURRENT SENSING CIRCUIT AND CONTROL CIRCUIT THEREOF AND POWER CONVERTER CIRCUIT

FIELD OF THE INVENTION

The present invention relates to the field of the circuit, and particularly relates to an current detection circuit, and a control circuit and a power conversion circuit thereof.

BACKGROUND OF THE INVENTION

The power conversion circuits, such as AC-DC conversion circuits, can convert the alternating current into the direct current to supply power to the relevant apparatuses. However, an existing power conversion circuits usually don't have the output current detection function.

DISCLOSURE OF THE INVENTION

Technical Problem

An object of the embodiments of the present invention is to provide a current detection circuit for the power conversion circuit, which can detect the output current and features with high reliability, simple structure, and low cost.

Another object of the embodiments of the present invention is to provide a control circuit for the above-mentioned current detection circuit.

Another object of the embodiments of the present invention is to provide a power conversion circuit with the above-mentioned control circuit.

Technical Solution

The embodiments of the present invention are implemented as follows: a current detection circuit for the power conversion circuit, comprising a sample and hold circuit, a rising edge detection circuit, a falling edge detection circuit, a timing control circuit, a synchronous detection circuit, and a low-pass filter, wherein, the first terminal of the sample and hold circuit is connected with the third terminal of the drive control tube, the second terminal of the sample and hold circuit is connected with the first terminal of the timing control circuit, and the third terminal of the sample and hold circuit is connected with the first terminal of the synchronous detection circuit; the first terminal of the rising edge detection circuit is connected with the second terminal of the main switch S1, and the second terminal of the rising edge detection circuit is connected with the second terminal of the timing control circuit; the first terminal of the falling edge detection circuit is connected with the second terminal of the main switch S1, and the second terminal of the falling edge detection circuit is connected with the third terminal of the timing control circuit; the fourth terminal of the timing control circuit is connected with the second terminal of the synchronous detection circuit, and the third terminal of the synchronous detection circuit is connected with the first terminal of the low-pass filter, and the second terminal of the low-pass filter is the output terminal of the current detection circuit.

The embodiments of the present invention provide a power conversion circuit with the above-mentioned control circuit, which comprising:

A filter circuit 12, connected with an external AC power supply and designed to filter off the noise in the AC power supply; a rectifier circuit 13, connected with the filter circuit and designed to convert the alternating current into direct current; and A single-stage power conversion circuit 14, comprising a capacitor C1, an inductor or switching transformer L, a diode D1, a capacitor C2, a main switch S1, a drive control tube S2, a resistor R2, a control circuit, and an auxiliary power supply circuit, wherein, the first terminal of the capacitor C1 is connected with the rectifier circuit and the negative electrode of a DC load, and the second terminal of the capacitor C1 is grounded; the first terminal of the inductor or switching transformer L is connected with the negative electrode of the DC load, the second terminal of the inductor or switching transformer L is connected with the positive electrode of the diode D1, and the negative electrode of the diode D1 is connected with the positive electrode of the DC load; the capacitor C2 is connected between the positive electrode and negative electrode of the DC load; the first terminal of the main switch S1 is connected with the negative electrode of the DC load through the auxiliary power supply circuit, and the second terminal of the main switch S1 is connected with the positive electrode of the diode D1; the first terminal of the drive control tube S2 is connected with the control circuit, the second terminal of the drive control tube S2 is connected with the third terminal of the main switch S1, and the third terminal of the drive control tube S2 is grounded through the resistor R2 and is also connected with the control circuit; the control circuit is also connected to the second terminal of the main switch S1; the single-stage power conversion circuit is designed to regulate the power factor, and obtain the output current signals through computation by detecting the circuit current through the main switch.

Beneficial Effects

The current detection circuit for the power conversion circuit provided in the present invention obtains the output current signals through computation by detecting the circuit current through the main switch.

DETAILED DESCRIPTION OF THE EMBODIMENTS

To make the objects, technical solution and advantages of the present invention understood more clearly, the present invention will be further detailed in embodiments, with reference to the accompanying drawings. It should be understand that the embodiments described here are only provided to interpret the present invention, but not to limit the present invention.

A current detection circuit for the power conversion circuit is provided in the embodiments of the present invention. The current detection circuit can detect the output current and features with high reliability, simple structure.

Figure 1:
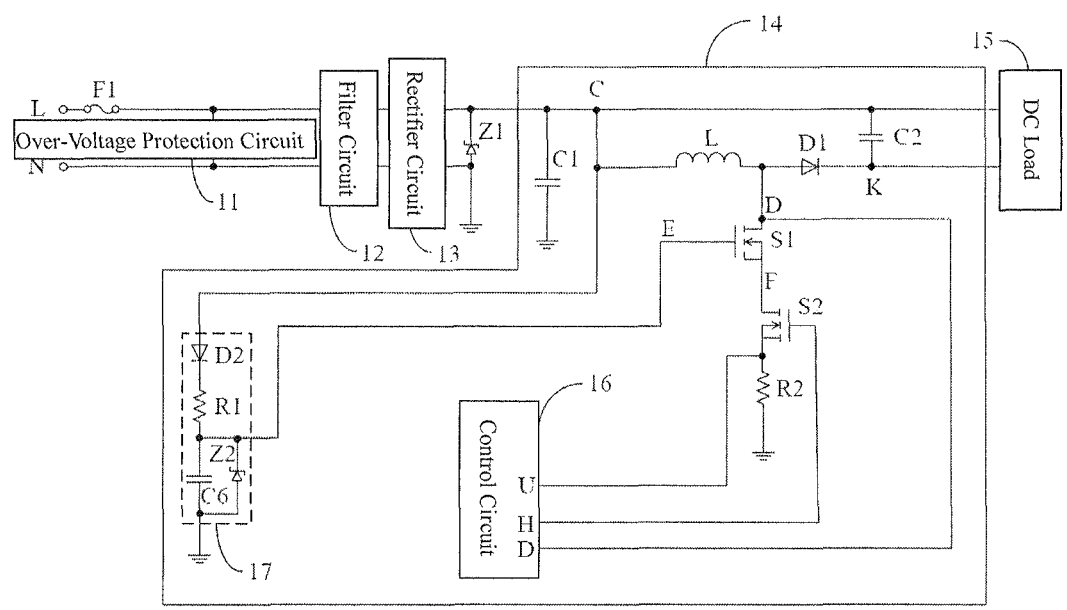
FIG. 1 is a circuit diagram of a power conversion circuit that applies the current detection circuit provided in the present invention.

Referring to FIG. 1. The power conversion circuit provided in the present invention comprises a filter circuit 12, a rectifier circuit 13 and a single-stage power conversion circuit 14.

The filter circuit 12 is connected with both the live wire L and null wire N of the external AC power supply.

The rectifier circuit 13 is connected with the external AC power supply through the filter circuit 12.

The single-stage power conversion circuit 14 is connected between the positive output terminal of the rectifier circuit 13 and a DC load 15. Here the node between the positive output terminal of the rectifier circuit 13 and the DC load 15 is denoted as "C".

Wherein, the filter circuit 12 is a filter circuit well-known in the art, and the rectifier circuit 13 is a bridge rectifier circuit. They will not be described further here.

The single-stage power conversion circuit 14 comprises a capacitor C1, an inductor or switching transformer L, a diode D1, a capacitor C2, a main switch S1, a drive control tube S2, a resistor R2, a control circuit 16, and an auxiliary power supply circuit 17.

The first terminal of the capacitor C1 is connected with the rectifier circuit 13 and the negative electrode of the DC load 15, and the second terminal of the capacitor C1 is grounded; the first terminal of the inductor or switching transformer L is connected with the negative electrode of the DC load 15, the second terminal of the inductor or switching transformer L is connected with the positive electrode of the diode D1, and the negative electrode of the diode D1 is connected with the positive electrode of the DC load 15; the capacitor C2 is connected between the positive electrode and negative electrode of the DC load 15; the first terminal of the main switch S1 is connected with the negative electrode of the DC load 15 through the auxiliary power supply circuit 17, and the second terminal of the main switch S1 is connected with the positive electrode of the diode D1; the first terminal of the drive control tube S2 is connected with the first terminal H of the control circuit 16, the second terminal of the drive control tube S2 is connected with the third terminal of the main switch S1, and the third terminal of the drive control tube S2 is grounded through the resistor R2 and is also connected with the second terminal U of the control circuit 16, the third terminal D of the control circuit 16 is connected with the second terminal of the main switch S1.

The main switch S1 and the drive control tube S2 are N-channel field effect tubes. Here, the node between the drain electrode of the main switch S1 and the positive electrode of the diode D1 is denoted as "D", the node between the gate electrode of the main switch S1 and the auxiliary power supply circuit 17 is denoted as "E", and the node between the drain electrode of the drive control tube S2 and the source electrode of the main switch S1 is denoted as "F".

Figure 2:
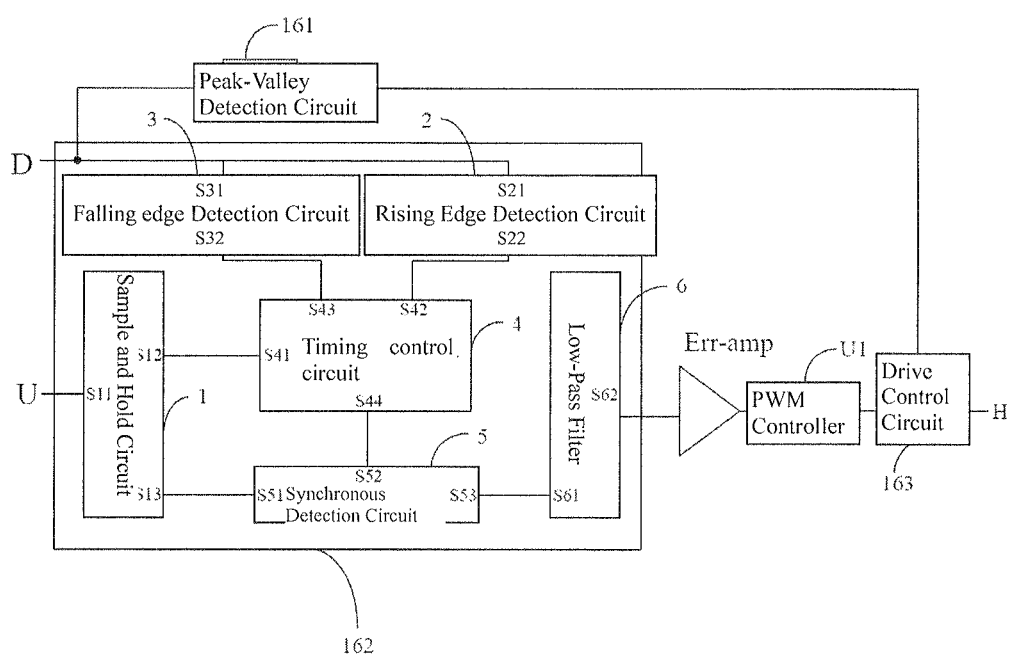
FIG. 2 is a schematic circuit diagram of a control circuit that has the current detection circuit provided in the present invention in FIG. 1.

Referring to FIG. 2. The control circuit 16 comprises a peak-valley detection circuit 161, a current detection circuit 162, an error amplifier Err_amp, a PWM controller U1, and a drive control circuit 163; the input terminal U of the current detection circuit 162 is connected with the third terminal of the drive control tube S2, the input terminal D of the current detection circuit 162 is connected with the second terminal of the main switch S1, and the output terminal of the current detection circuit 162 is connected with the input terminal of the error amplifier Err_amp; the output terminal of the error amplifier Err_amp is connected with the PWM controller U1, which is connected with the first terminal of the drive control circuit 163; the second terminal of the drive control circuit 163 is connected with the output terminal of the peak-valley detection circuit 161, and the third terminal of the drive control circuit 163 is connected with the first terminal of the drive control tube S2; the input terminal of the peak-valley detection circuit 161 is connected with the second terminal of the main switch S1.

The auxiliary power supply circuit 17 comprises a diode D2, a resistor R1, a capacitor C6, and a voltage-stabilizing tube Z2, wherein, the positive electrode of the diode D2 is connected with the negative electrode of the DC load 15, and the negative electrode of the diode D2 is grounded through the resistor R1 and capacitor C6 in turn; the node between the resistor R1 and capacitor C6 is connected with the first terminal of the main switch S1; the positive electrode of the voltage-stabilizing tube Z2 is grounded, and the negative electrode of voltage-stabilizing tube Z2 is connected with the first terminal of the main switch S1.

The working process of the power conversion circuit in the present invention will be described as follows:

The filter circuit 12 is designed to filter off the noise in the AC power supply, the rectifier circuit 13 is designed to carry out AC-DC conversion, and the single-stage power conversion circuit 14 is designed to regulate the power factor of the power conversion circuit and detect the output current. Wherein, the auxiliary power supply circuit 17 in the single-stage power conversion circuit 14 is designed to provide auxiliary power supply, the control circuit 16 is designed to detect the output current which output to the DC load 15, and regulate the average output current value which output to the DC load 15 to a predetermined value set in it, so as to achieve constant current output control.

The input control terminal E of the main switch S1 is clamped to a fixed level after power-on, and the ON/OFF of the main switch S1 is mainly controlled by the drive control tube S2. Once the main switch S1 switches on, the current in the inductor L will rise up; when the main switch S1 switches off, the voltage at the point D above the main switch S1 will rise up from 0 gradually (switch off at voltage "0") due to the effect of the parasitic capacitance of the main switch S1 and diode D1; once the potential at point D exceeds the potential at point K of the DC load 15, the diode D1 will gate on, and the current in the inductor L will be output to the DC load 15 through the diode D1 which will drop from the peak value; once the current in the inductor L drops to 0, the potential at the point D above the main switch S1 will drop owing to the resonance effect between the parasitic capacitance of the diode D1 and main switch S1 and the inductor L; after a while, a peak-valley voltage value will occur at the point D above the main switch S1.

The peak-valley detection circuit 161 is mainly designed to control the switch-on moment of the single-stage power conversion circuit 14 through detects the voltage at the terminal D, and, when a peak-valley voltage value occurs, sends the detected result to the drive control circuit 163, the drive control circuit 163 and drive control tube S2 drive the main switch S1 to switch on at that moment and thereby achieve switch-on at "zero" voltage, reduce the switching loss. In the working process of the circuit, as the ON time of the main switch S1 increases, the working current in the inductor L and the current output to the load 15 will increase; as the ON time of the main switch S1 decreases, the working current in the inductor L and the current output to the load 5 will decrease.

Referring to FIG. 2. The control circuit 16 and the single-stage power conversion circuit 14 have three connection ports: D, U and H. The ports D and U are two input terminals of the control circuit 16, and the control circuit 16 generates a control signal at port H according to the information from the two input terminals, so as to control the drive control tube S2, and thereby control the operation of the entire single-stage power conversion circuit 14. The control circuit 16 needs to obtain the information on the current output to the load 15, so as to control the switching circuit and obtain the better power supply efficiency and power factor.

The power conversion circuit in the present invention filters off the noise in the AC power supply through the filter circuit 12, carries out AC-DC conversion through the rectifier circuit 13, and detects the output current and regulates the power factor through the single-stage power conversion circuit 14.

Furthermore, the power conversion circuit in the present invention further comprises a fuse F1. The fuse F1 is connected between the live wire L and the filter circuit 12. In case the current flow through the fuse F1 is too high, the fuse F1 will be fusing to protect the power conversion circuit.

Referring to FIG. 2. Moreover, the current detection circuit 162 further comprises a sample and hold circuit 1, a rising edge detection circuit 2, a falling edge detection circuit 3, a timing control circuit 4, a synchronous detection circuit 5, and a low-pass filter 6.

The first terminal S11 of the sample and hold circuit 1 is connected with the node U, the second terminal S12 of the sample and hold circuit 1 is connected with the first terminal S41 of the timing control circuit 4, and the third terminal S13 of the sample and hold circuit 1 is connected with the first terminal S51 of the synchronous detection circuit 5.

The first terminal S21 of the rising edge detection circuit 2 is connected with the node D, and the second terminal S22 of the rising edge detection circuit 2 is connected with the second terminal S42 of the timing control circuit 4.

The first terminal S31 of the falling edge detection circuit 3 is connected with the node D, and the second terminal S32 of the falling edge detection circuit 3 is connected with the third terminal S43 of the timing control circuit 4.

The fourth terminal S44 of the timing control circuit 4 is connected with the second terminal S52 of the synchronous detection circuit 5.

The third terminal S53 of the synchronous detection circuit 5 is connected with the first terminal S61 of the low-pass filter 6. The second terminal S62 of the low-pass filter 6 is connected with the input terminal of the error amplifier Err_amp.

The control circuit 16 detects the current through the sample resistor R2 by the current detection circuit 162 and treats the current signal, so as to obtain the current average value output to the DC load 15, input the current average value to the drive control circuit 163, and compare with the preset value, to decide whether to increase or decrease the ON time of the main switch S1, and thereby regulate the output current to the preset value. No matter whether the DC load 15 or the input voltage varies, the drive control circuit 163 can dynamically regulates the ON/OFF time of the main switch S1 to obtain the expected current output from the DC load 15.

Figure 3:
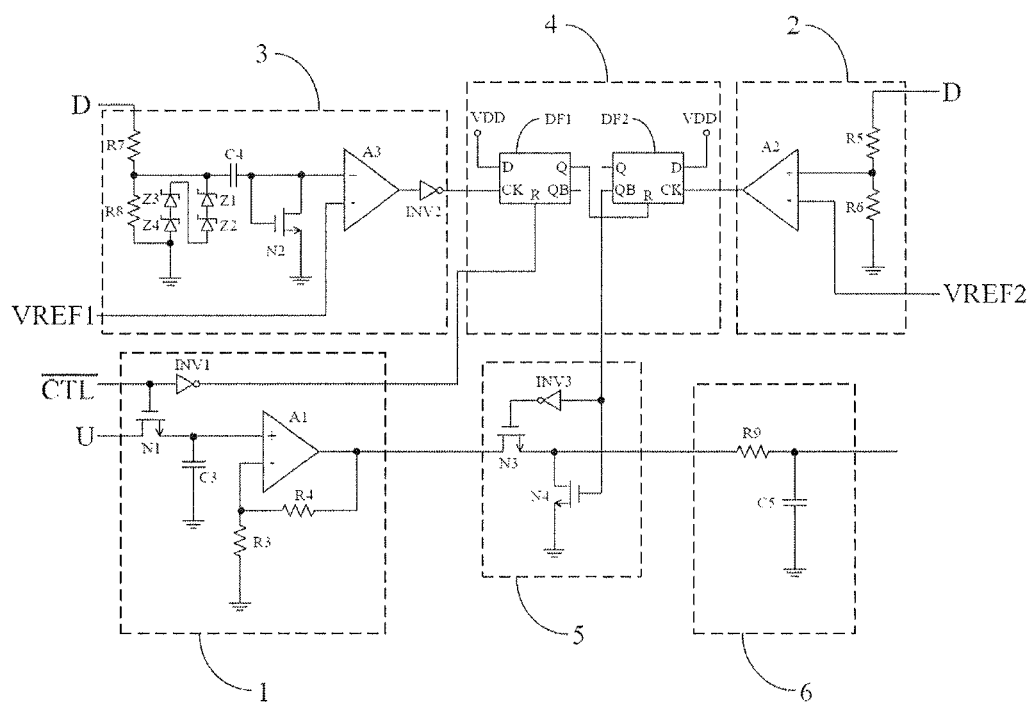
FIG. 3 is a circuit diagram of a first preferred embodiment of the current detection circuit provided in the present invention.

Referring to FIG. 3, as a preferred embodiment of the present invention, the sample and hold circuit 1 in the current detection circuit 162 comprises an N-channel FET N1, an inverter INV1, a capacitor C3, an amplifier A1, and resistors R3 and R4. The drain electrode of the N-channel FET N1 is connected with the node U, the gate electrode of N1 is connected with the input terminal of the inverter INV1, and the source electrode of N1 is grounded through the capacitor C3. The input terminal of the inverter INV1 is connected with a control terminal CTL. The non-inverting input terminal of the amplifier A1 is connected with the source electrode of the N-channel FET N1, the inverting input terminal of A1 is grounded through the resistor R3, and the output terminal of A1 is connected with the inverting input terminal through the resistor R4. The current sample and hold circuit 1 is in sample mode when the main switch S1 is in ON state, and outputs a signal that is proportional to the input current signal; the current sample and hold circuit 1 will enter into hold mode when the main switch S1 switches off.

The rising edge detection circuit 2 comprises an amplifier A2 and resistors R5 and R6. One terminal of the resistor R5 is connected with the node D, and the other terminal of the resistor R5 is grounded through the resistor R6. The non-inverting input terminal of the amplifier A2 is connected to the node between the resistor R5 and resistor R6, and the inverting input terminal of the amplifier A2 is connected with a reference voltage terminal VREF2. Once the rising edge detection circuit 2 detects that the voltage at the point above the main switch S1 rises to a preset value, it will trigger a latch circuit and control the synchronous detection circuit 5 to work, and output the signals from the current sample and hold circuit 1 to the low-pass filter 6.

The falling edge detection circuit 3 comprises an amplifier A3, an inverter INV2, an N-channel FET N2, a capacitor C4, clamping Zener diodes Z1~Z4, and resistors R7 and R8. One terminal of the resistor R7 is connected with the node D, and the other terminal of the resistor R5 is grounded through the resistor R8. One terminal of the capacitor C4 is connected with the node between the resistor R7 and resistor R8, and the other terminal of the capacitor C4 is connected with the non-inverting input terminal of the amplifier A3. The inverting input terminal of the amplifier A3 is connected with a reference voltage terminal VREF1, and the output terminal of the amplifier A3 is connected with the input terminal of the inverter INV2. The gate electrode and drain electrode of the N-channel FET N2 are connected with the non-inverting input terminal of the amplifier A3, and the source electrode of N2 is grounded. The negative electrode of the clamping Zener diode Z1 is connected to the node between the resistor R7 and resistor R8, and the positive electrode of Z1 is grounded through clamping Zener diodes Z2~Z4 in sequence. Once the falling edge detection circuit 3 detects a falling edge of voltage at the point above the main switch S1, it will unlock the latch and cut off the synchronous detection circuit 5, to force the input signal of the low-pass filter 6 to "0".

The timing control circuit 4 comprises D flip-flops DF1 and DF2. The clock signal terminal CK of the D flip-flop DF1 is connected with the output terminal of the inverter INV2 in the falling edge detection circuit 3, the reset terminal R of DF1 is connected with the output terminal of the inverter INV1 in the sample and hold circuit 1, the signal input terminal D of DF1 is connected with a power supply VDD, the output terminal Q of DF1 is connected with the reset terminal R of the D flip-flop DF2, and the inverted output terminal QB of DF1 is free. The terminal CK of the D flip-flop DF2 is connected with the output terminal of the amplifier A2 in the rising edge detection circuit 2, the signal input terminal D of DF2 is connected with the power supply VDD, and the output terminal Q of DF2 is free.

The synchronous detection circuit 5 comprises an inverter INV3 and N-channel FETs N3 and N4. The input terminal of the inverter INV3 is connected with the inverted output terminal QB of the D flip-flop DF2 in the timing control circuit 4, and the output terminal of INV3 is connected with the gate electrode of the N-channel FET N3. The drain electrode of the N-channel FET N3 is connected with the output terminal of the amplifier A1 in the sample and hold circuit 1, and the source electrode of N3 is connected with the drain electrode of the N-channel FET N4. The gate electrode of the N-channel FET N4 is connected with the input terminal of the inverter INV3, and the source electrode of N4 is grounded.

The low-pass filter 6 comprises a resistor R9 and a capacitor C5. One terminal of the resistor R9 is connected with the drain electrode of the N-channel FET N4 in the synchronous detection circuit 5, and the other terminal of the resistor R9 is grounded through the capacitor C5 and is also connected with the input terminal of the error amplifier; the low-pass filter 6 filters the input signal and then outputs a signal that is proportional to the current average value output from the DC load 15.

Figure 5:
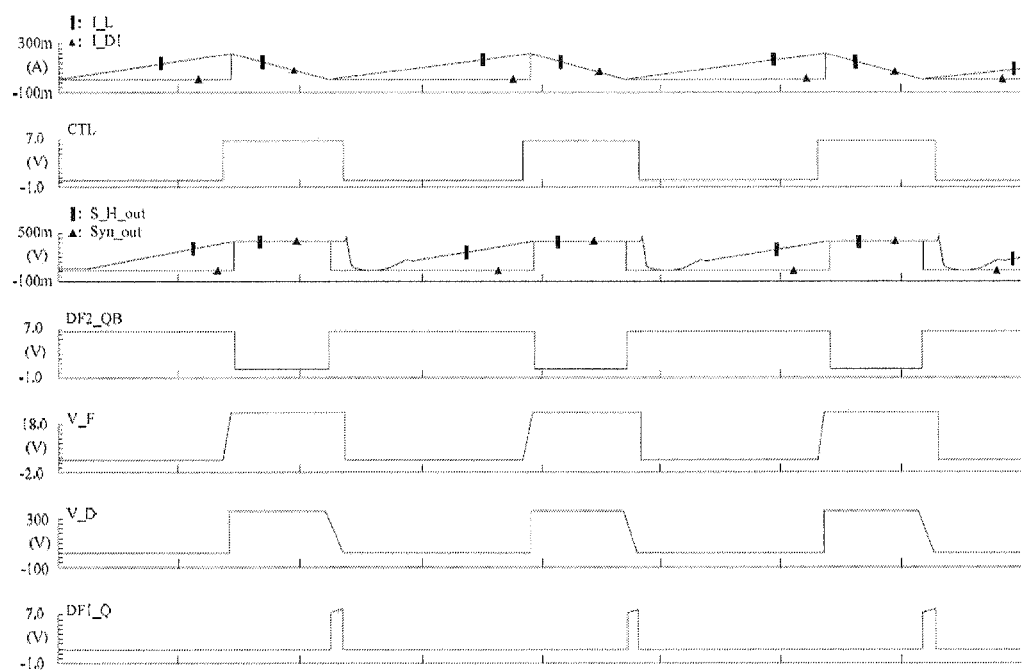
FIG. 5 is a waveform schematic diagram at the points shown in FIG. 1 and FIG. 2.

Referring to FIG. 5 at the same time. The current waveform of the inductor L is denoted as "I_L", the current waveform of the diode D1 is denoted as "I_D1", the voltage waveform of the node F is denoted as "V_F", the voltage waveform of the node D is denoted as "V_D", the output signal waveform of the sample and hold circuit 1 is denoted as "S_H_out", the output signal waveform of the synchronous detection circuit 5 is denoted as "Syn_out", the output waveform of output terminal Q of the D flip-flop DF1 is denoted at "DF1_Q", and the output waveform of inverted output terminal QB of the D flip-flop DF2 is denoted as "DF2_QB".

It can be seen from FIG. 5 that the current average value I_avr output to the DC load 15 is equal to the average value of I_D1, i.e., equal to the peak value of I_D1 divided by 2 and multiplied by the duty ratio. From the viewpoint of actual application, only a signal proportional to I_avr is required. Hereafter how the current detection circuit 162 acquires such a signal will be described as follows:

When the main switch S1 switches on, the signal from node U is inputted to the sample and hold circuit 1. When the main switch S1 is in ON state, the sample and hold circuit 1 is in sample mode, and the output signal S_H_out of the sample and hold circuit 1 follows the electric current I_L of the inductor L; the synchronous detection circuit 5 is in OFF state, and the output signal Syn_out of the synchronous detection circuit 5 is at low level.

At the end of the "ON" period of the main switch S1, the voltage V_F at the node F rises up, the main switch S1 switches off, and the potential V_D at the main node D rises up; when the potential at the node D is close to the potential at the node C, the electric current I_L in the inductor will be discharged to the DC load 15 through the diode D1. The rising edge detection circuit 2 acts, and outputs the actuating signal to the timing control circuit 4; the timing control circuit 4 forces the sample and hold circuit 1 into hold mode; Then, voltage held in the sample and hold circuit 1 is proportional to the peak value of current in inductor L. Since the peak value of current in the inductor L is equal to the peak value of current in the diode D1, the output S_H_out of the sample and hold circuit 1 is proportional to the peak value of the current I_D1 in diode D1.

That signal will remain unchanged before the current I_L in inductor L decreases to 0, owing to the sample and hold circuit 1 is in hold mode in the period. At this point, the synchronous detection circuit 5 is in ON state, and the output S_H_out of the sample and hold circuit 1 is outputted to the low-pass filter 6 through the synchronous detection circuit 5. As the current I_L in the inductor L is discharged to the DC load 15 through the diode D1, the current I_L in the inductor L decreases gradually.

When the current I_L in inductor L decreases to "0", the potential at the node D begin to drop; when the falling edge detection circuit 3 detects a voltage drop signal at the node D, it will act and output the actuating signal to the timing control circuit 4, and the timing control circuit 4 will cut off the synchronous detection circuit 5 and thereby force the input signal of the low-pass filter 6 to "0". In the ON-OFF cycle, the input signal average value output to the low-pass filter 6 is proportional to the average output current value in the cycle, i.e., the low-pass filter outputs a signal that is proportional to the output current I_avr average value.

The voltage signal output from the low-pass filter 6 is fed into an error amplifier Err_amp together with an internally preset reference value; if the average output current is higher than the internally preset reference value, the output of the error amplifier Err_amp will decrease the ON time of the main switch S1 slowly through the PWM controller U1; if the average output current is lower than the internally preset reference value, the output of error amplifier Err_amp will increase the ON time of the main switch S1 slowly through the PWM controller U1. Finally, the average output current value is regulateed to be equal to the internally preset reference value, and thereby constant current output control is achieved.

At the end of the OFF period of the main switch S1, the main switch S1 will switch on again, and the circuit will enter into the next cycle.

When V_F is at low level, the main switch S1 will switch on, and the terminal D2_QB of the D flip-flop DF2 will output high level. The signal from the current sample resistor R2 is input to the FET N1 in the sample and hold circuit 1. The sequence of the signal applied to the gate electrode of FET N1 is synchronous with the driving signal of the main switch S1. When the main switch S1 is in ON state, the control terminal CTL is at high level (inversed to V_F), and the sample and hold circuit 1 is in sample mode; at this point, the terminal D1_Q of the D flip-flop DF1 in the timing control circuit 4 outputs high level, the terminal D2_QB of the D flip-flop DF2 outputs high level, the FET N4 in the synchronous detection circuit 5 gates on to the ground, the FET N3 in the synchronous detection circuit 5 gates off, and the output of the synchronous detection circuit 5 is "0".

At the end of the ON period of the main switch S1, V_F changes into high level, the main switch S1 switches off, the control terminal CTL changes into low level, the sample and hold circuit 1 enters into hold mode, the D flip-flop DF1 resets, the output of the terminal D1_Q of the D flip-flop DF1 is at low level, and the D flip-flop DF2 is relieved from reset state. As the main switch S1 switches off, the potential at point D above the main switch S1 rises up; when the potential at the point D gets close to the potential at the point C, the rising edge detection circuit 2 acts, and the output of the amplifier A2 increases and triggers the D flip-flop DF2 in the timing control circuit 4, the output of the terminal D2_QB decreases, and therefore the FET N3 in the synchronous detection circuit 5 gates on, the FET N4 in the synchronous detection circuit 5 gates off, and the output signal of the sample and hold circuit 1 is output to the input terminal of the low-pass filter circuit 6. At this point, the current I_L in the inductor L is discharged to the DC load 15 and thereby decreases gradually.

Figure 4:
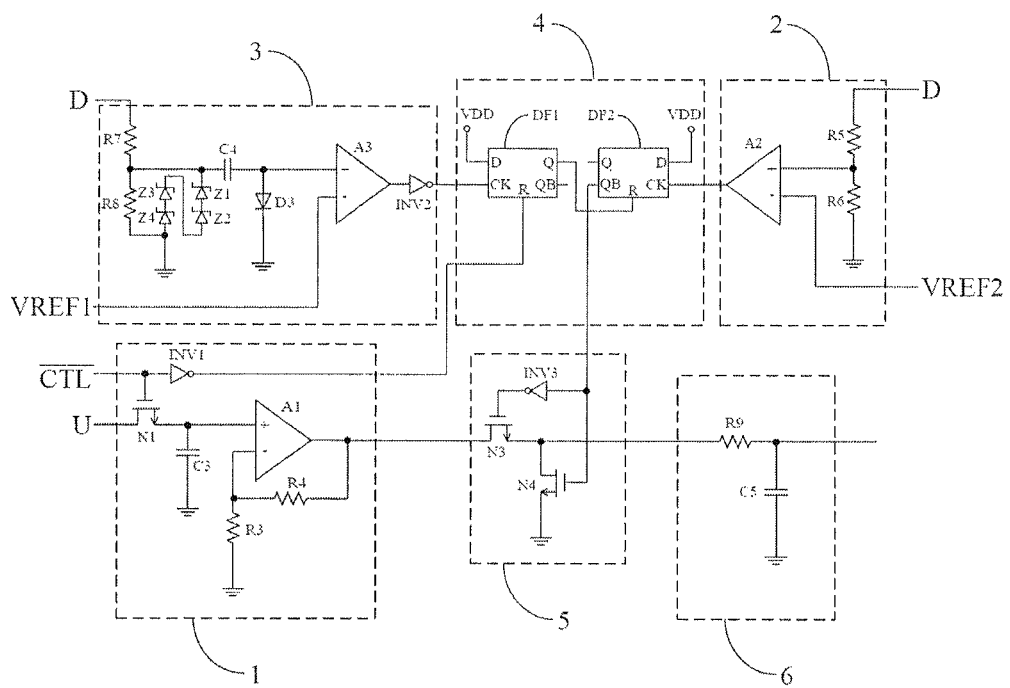
FIG. 4 is a circuit diagram of a second preferred embodiment of the current detection circuit provided in the present invention.

Referring to FIG. 4. In another preferred embodiment of the present invention, the N-channel FET N1 in the falling edge detection circuit 3 in the current detection circuit 162 may be replaced with a diode D3. The positive electrode of the diode D3 is connected with the non-inverting input terminal of the amplifier A1, and the negative electrode of the diode D3 is grounded.

The power conversion circuit in the present invention filters off the noise in the AC power supply through the filter circuit 12, accomplishes AC-DC conversion through the rectifier circuit 13, and regulates the power factor and regulates the average output current to equal to an internally preset value through the single-stage power conversion circuit 14, and thereby achieves constant current output control.

The above are only some preferred embodiments of the present invention. Any modification, equivalent replacement, and improvement made without departing from the spirit and principle of the present invention shall be deemed as falling into the protected scope of the present invention.

The invention claimed is:

1. A current detection circuit for the power conversion circuit, wherein, the current detection circuit comprising a sample and hold circuit, a rising edge detection circuit, a falling edge detection circuit, a timing control circuit, a synchronous detection circuit, and a low-pass filter, wherein, the first terminal of the sample and hold circuit is connected with the third terminal of a drive control tube S2, the second terminal of the sample and hold circuit is connected with the first terminal of the timing control circuit, and the third terminal of the sample and hold circuit is connected with the first terminal of the synchronous detection circuit; the first terminal of the rising edge detection circuit is connected with the second terminal of a main switch S1, and the second terminal of the rising edge detection circuit is connected with the second terminal of the timing control circuit; the first terminal of the falling edge detection circuit is connected with the second terminal of main switch S1, and the second terminal of the falling edge detection circuit is connected with the third terminal of the timing control circuit; the fourth terminal of the timing control circuit is connected with the second terminal of the synchronous detection circuit, the third terminal of the synchronous detection circuit is connected with the first terminal of the low-pass filter, and the second terminal of the low-pass filter is the output terminal of the current detection circuit.

2. The current detection circuit for the power conversion circuit according to claim 1, wherein, said sample and hold circuit comprises a FET N1, an inverter INV1, a capacitor C3, an amplifier A1, and resistors R3 and R4, the drain electrode of the FET N1 serves as the first terminal of the sample and hold circuit, the gate electrode of N1 is connected with the input terminal of the inverter INV1, and the source electrode of N1 is grounded through the capacitor C3; the signal at the input terminal of the inverter INV 1 is in phase with the control signal at the first terminal of the drive control tube S2, and the output terminal of the inverter INV 1 serves as the second terminal of the sample and hold circuit; the non-inverting input terminal of the amplifier A1 is connected with the source electrode of the FET N1, the inverting input terminal of the amplifier Al is grounded through the resistor R3, and the output terminal of the amplifier Al is connected with the inverting input terminal through the resistor R4 and serves as the third terminal of the sample and hold circuit; the current sample and hold circuit is in sample mode when the main switch S1 is in ON state, and outputs a signal that is proportional to the input current signal; the current sample and hold circuit enters into hold mode once the main switch S1 switches off.

3. A control circuit utilizing the current detection circuit according to claim 2, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak-valley detection circuit, and the input terminal of the peak-valley detection circuit is connected with the second terminal of the main switch S1.

4. The current detection circuit for the power conversion circuit according to claim 1, wherein, the rising edge detection circuit comprises an amplifier A2 and resistors R5 and R6; the first terminal of resistor R5 serves as the first terminal of the rising edge detection circuit, and the second terminal of the resistor R5 is grounded through the resistor R6; the non-inverting input terminal of the amplifier A2 is connected to the node between the resistor R5 and resistor R6, the inverting input terminal of the amplifier A2 is connected with a reference voltage terminal, and the output terminal of the amplifier A2 serves as the second terminal of the rising edge detection circuit and is connected with the second terminal of the timing control circuit; when the rising edge detection circuit detects that the voltage at the point above the main switch S1 rises to a preset value, it will trigger a latch circuit and control the synchronous detection circuit to output the signal from the current sample and hold circuit to the low-pass filter circuit.

5. A control circuit utilizing the current detection circuit according to claim 4, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak-valley detection circuit, and the input terminal of the peak-valley detection circuit is connected with the second terminal of the main switch S1.

6. The current detection circuit for power conversion circuit according to claim 1, wherein, said falling edge detection circuit comprises an amplifier A3, an inverter INV2, a FET N2, a capacitor C4, clamping Zener diodes Z1~Z4, and resistors R7 and R8; the first terminal of the resistor R7 serves as the first terminal of the falling edge detection circuit, and the second terminal of the resistor R7 is grounded through the resistor R8; the first terminal of the capacitor C4 is connected to the node between the resistor R7 and resistor R8, and the second terminal of the capacitor C4 is connected with the non-inverting input terminal of the amplifier A3; the inverting input terminal of the amplifier A3 is connected with a reference voltage terminal, the output terminal of the amplifier A3 is connected with the input terminal of the inverter INV2, and the output terminal of the inverter INV2 serves as the second terminal of the falling edge detection circuit; the gate electrode and drain electrode of the FET N2 are connected with the non-inverting input terminal of the amplifier A3, and the source electrode of the FET N2 is grounded; the negative electrode of the clamping Zener diode Z1 is connected to the node between the resistor R7 and the resistor R8, and the positive electrode of the clamping Zener diode Z1 is grounded through the clamping Zener diodes Z2, Z3, and Z4 in turn; when the falling edge detection circuit detects a falling edge of voltage at the point above the main switch S1, it will unlock the latch and cut off the synchronous detection circuit, and thereby force the input signal of the low-pass filter circuit to "0".

7. A control circuit utilizing the current detection circuit according to claim 6, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak-valley detection circuit, and the input terminal of the peak-valley detection circuit is connected with the second terminal of the main switch S1.

8. The current detection circuit for the power conversion circuit according to claim 1, wherein, the timing control circuit comprises a D flip-flop DF1 and a D flip-flop DF2; the reset terminal of the D flip-flop DF1 serves as the first terminal of the timing control circuit and is connected with the second terminal of the sample and hold circuit, the clock signal terminal of the D flip-flop DF1 serves as the third terminal of the timing control circuit and is connected with the second terminal of the falling edge detection circuit, the signal input terminal of the D flip-flop DF1 is connected with the power supply, the output terminal of the D flip-flop DF1 is connected with the reset terminal of the D flip-flop DF2, and the inverted output terminal of the D flip-flop DF1 is free; the clock signal terminal of the D flip-flop DF2 serves as the second terminal of the timing control circuit and is connected with the second terminal of the rising edge detection circuit, the signal input terminal of the D flip-flop DF2 is connected with the power supply, the output terminal of the D flip-flop DF2 is free, and the inverted output terminal of the D flip-flop DF2 serves as the fourth terminal of the timing control circuit and is connected with the second terminal of the synchronous detection circuit.

9. A control circuit utilizing the current detection circuit according to claim 8, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak-valley detection circuit, and the input terminal of the peak-valley detection circuit is connected with the second terminal of the main switch S1.

10. The current detection circuit for the power conversion circuit according to claim 1, wherein, the synchronous detection circuit comprises an inverter INV3 and FETs N3 and N4; the drain electrode of the FET N3 serves as the first terminal of the synchronous detection circuit and is connected with the third terminal of the sample and hold circuit, the source electrode of the FET N3 is connected with the drain electrode of the FET N4, and the gate electrode of the FET N3 is connected with the output terminal of the inverter INV3; the input terminal of the inverter INV3 serves as the second terminal of the synchronous detection circuit and is connected with the fourth terminal of the timing control circuit; the gate electrode of the FET N4 is connected with the input terminal of the inverter INV3, the source electrode of the FET N4 is grounded, and the drain electrode of FET N4 serves as the third terminal of the synchronous detection circuit and is connected with the first terminal of the low-pass filter.

11. A control circuit utilizing the current detection circuit according to claim 10, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak-valley detection circuit, and the input terminal of the peak-valley detection circuit is connected with the second terminal of the main switch S1.

12. The current detection circuit for the power conversion circuit according to claim 1, wherein, the first terminal of the low-pass filter is connected with the third terminal of the synchronous detection circuit, and the second terminal of the low-pass filter is connected with the input terminal of the error amplifier; the low-pass filter filters the input signal and then outputs a signal that is proportional to the average output current of a DC load 15.

13. A control circuit utilizing the current detection circuit according to claim 12, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak- valley detection circuit, and the input terminal of the peak-valley detection circuit is connected with the second terminal of the main switch S1.

14. A control circuit utilizing the current detection circuit according to claim 1, further comprising a peak-valley detection circuit, an error amplifier, a PWM controller, and a drive control circuit, wherein, the terminal U of the current detection circuit is connected with the third terminal of the drive control tube S2, the terminal D of the current detection circuit is connected with the second terminal of the main switch S1, and the output terminal of the current detection circuit serves as the second terminal of the low-pass filter and is connected with the input terminal of the error amplifier; the output terminal of the error amplifier is connected with the PWM controller, and the PWM controller is connected with the drive control circuit; the drive control circuit is also connected with the output terminal of the peak-valley detection circuit, and the input terminal of the peak-valley detection circuit is connected with the second terminal of the main switch S1.

15. A power conversion circuit having the control circuit according to claim 14, comprising:
 a filter circuit, connected with an external AC power supply, and designed to filter off the noise in the external AC power supply;

a rectifier circuit, connected with the said filter circuit, and designed to convert the alternating current to the direct current; and a single-stage power conversion circuit, comprising a capacitor C1, an inductor or switching transformer L, a diode D1, a capacitor C2, a main switch S1, a drive control tube S2, a resistor R2, a control circuit, and an auxiliary power supply circuit, wherein, the first terminal of the capacitor C1 is connected with the rectifier circuit and the negative electrode of a DC load, and the second terminal of the capacitor C1 is grounded; the first terminal of the inductor or switching transformer L is connected with the negative electrode of the DC load, the second terminal of the inductor or transformer L is connected with the positive electrode of the diode D1, and the negative electrode of the diode D1 is connected with the positive electrode of the DC load; the capacitor C2 is connected between the positive electrode and negative electrode of the DC load; the first terminal of the main switch S1 is connected with the negative electrode of the DC load through the auxiliary power supply circuit, and the second of the main switch S1 is connected with the positive electrode of the diode D1; the first terminal of the drive control tube S2 is connected with the control circuit, the second terminal of the drive control tube S2 is connected with the third terminal of the main switch S1, and the third terminal of the drive control tube S2 is grounded through the resistor R2 and is also connected with the control circuit; the control circuit is also connected with the second terminal of the main switch S1; the single-stage power conversion circuit is designed to regulate the power factor, and obtain output current signals through computation by detecting the circuit current through the main switch.

16. The power conversion circuit according to claim 15, wherein, the auxiliary power supply circuit comprises a diode D2, a resistor R1, a capacitor C6 and a voltage-stabilizing tube Z2; the positive electrode of the diode D2 is connected with the negative electrode of the DC load, and the negative electrode of the diode D2 is grounded through the resistor R1 and capacitor C6 in sequence; the node between the resistor R1 and capacitor C6 is connected with the first terminal of the main switch S1; the positive electrode of the voltage-stabilizing tube Z2 is grounded, and the negative electrode of the voltage-stabilizing tube Z2 is connected with the first terminal of the main switch S1.

* * * * *

UNITED STATES PATENT AND TRADEMARK OFFICE
CERTIFICATE OF CORRECTION

PATENT NO. : 8,963,515 B2
APPLICATION NO. : 13/641863
DATED : February 24, 2015
INVENTOR(S) : Jianning Sun Page 1 of 1

It is certified that error appears in the above-identified patent and that said Letters Patent is hereby corrected as shown below:

In the Claims

Claim 15, Col. 13, line 5, "Cl" should be --C1--.

Claim 15, Col. 13, line 9, "Cl" should be --C1--.

Claim 15, Col. 14, line 3, "51" should be --S1--.

Signed and Sealed this
Twenty-second Day of September, 2015

Michelle K. Lee
*Director of the United States Patent and Trademark Office*